(12) United States Patent
Philipp et al.

(10) Patent No.: US 7,646,632 B2
(45) Date of Patent: Jan. 12, 2010

(54) INTEGRATED CIRCUIT FOR SETTING A MEMORY CELL BASED ON A RESET CURRENT DISTRIBUTION

(75) Inventors: Jan Boris Philipp, Munich (DE); Thomas Happ, Dresden (DE); Bernhard Ruf, Sauerlach (DE); Christian Rüster, Augsburg (DE); Dieter Andres, München (DE); Petra Majewski, München (DE)

(73) Assignee: Qimonda AG, Munich (DE)

( * ) Notice: Subject to any disclaimer, the term of this patent is extended or adjusted under 35 U.S.C. 154(b) by 216 days.

(21) Appl. No.: 11/962,701

(22) Filed: Dec. 21, 2007

(65) Prior Publication Data
US 2009/0161415 A1 Jun. 25, 2009

(51) Int. Cl.
*G11C 11/00* (2006.01)

(52) U.S. Cl. .................. 365/163; 365/148; 365/189.16; 365/201

(58) Field of Classification Search .................. 365/163, 365/148, 158, 171, 173, 189.16, 201
See application file for complete search history.

(56) References Cited

U.S. PATENT DOCUMENTS

| | | | |
|---|---|---|---|
| 6,570,784 B2 | 5/2003 | Lowrey | |
| 6,687,153 B2 | 2/2004 | Lowrey | |
| 6,813,177 B2 * | 11/2004 | Lowrey et al. | 365/148 |
| 7,110,286 B2 | 9/2006 | Choi et al. | |
| 7,274,586 B2 | 9/2007 | Choi et al. | |
| 7,295,464 B2 | 11/2007 | Cho et al. | |
| 7,304,886 B2 | 12/2007 | Cho et al. | |
| 2005/0141261 A1 | 6/2005 | Ahn | |
| 2008/0062753 A1 * | 3/2008 | Cho et al. | 365/163 |

\* cited by examiner

*Primary Examiner*—VanThu Nguyen
*Assistant Examiner*—R Lance Reidlinger
(74) *Attorney, Agent, or Firm*—Dicke, Billig & Czaja, PLLC

(57) ABSTRACT

An integrated circuit includes an array of resistance changing memory cells and a first circuit. The first circuit is configured to set a selected memory cell to a crystalline state by applying a decreasing stair step pulse to the selected memory cell. The pulse is based on a reset current distribution for the array of memory cells.

23 Claims, 6 Drawing Sheets

INTEGRATED CIRCUIT FOR SETTING A MEMORY CELL BASED ON A RESET CURRENT DISTRIBUTION

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

The speed of a typical phase change memory is limited by the time used to set a memory cell to the crystalline state. In addition, the critical dimensions of memory cells within an array may vary due to the processes used to fabricate the memory cells. The amount of crystalline material coexisting with amorphous material should be precisely controlled to ensure consistent resistance values. Consistent resistance values having a narrow distribution of the different resistance levels ensure that a sufficient sensing margin can be obtained.

For these and other reasons, there is a need for the present invention.

SUMMARY

One embodiment provides an integrated circuit. The integrated circuit includes an array of resistance changing memory cells and a first circuit. The first circuit is configured to set a selected memory cell to a crystalline state by applying a decreasing stair step pulse to the selected memory cell. The pulse is based on a reset current distribution for the array of memory cells.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
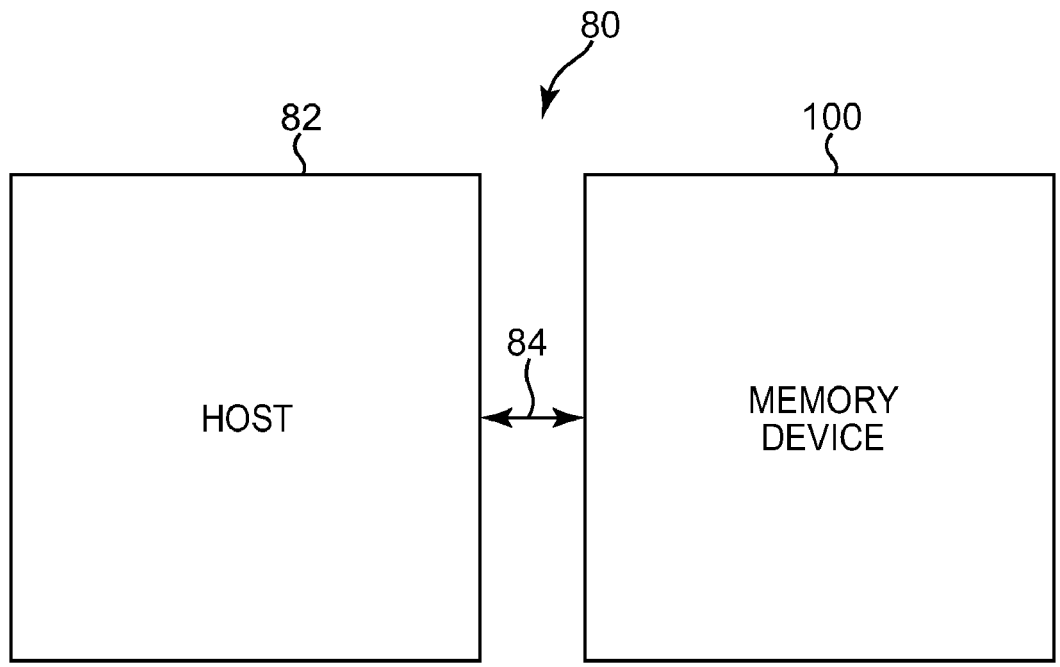
FIG. 1 is a block diagram illustrating one embodiment of a system.

FIG. 1 is a block diagram illustrating one embodiment of a system 80. System 80 includes a host 82 and a memory device 100. Host 82 is communicatively coupled to memory device 100 through communication link 84. Host 82 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 82. In one embodiment, memory device 100 includes a phase change memory device or other suitable resistive or resistivity changing material memory device.

Figure 2:
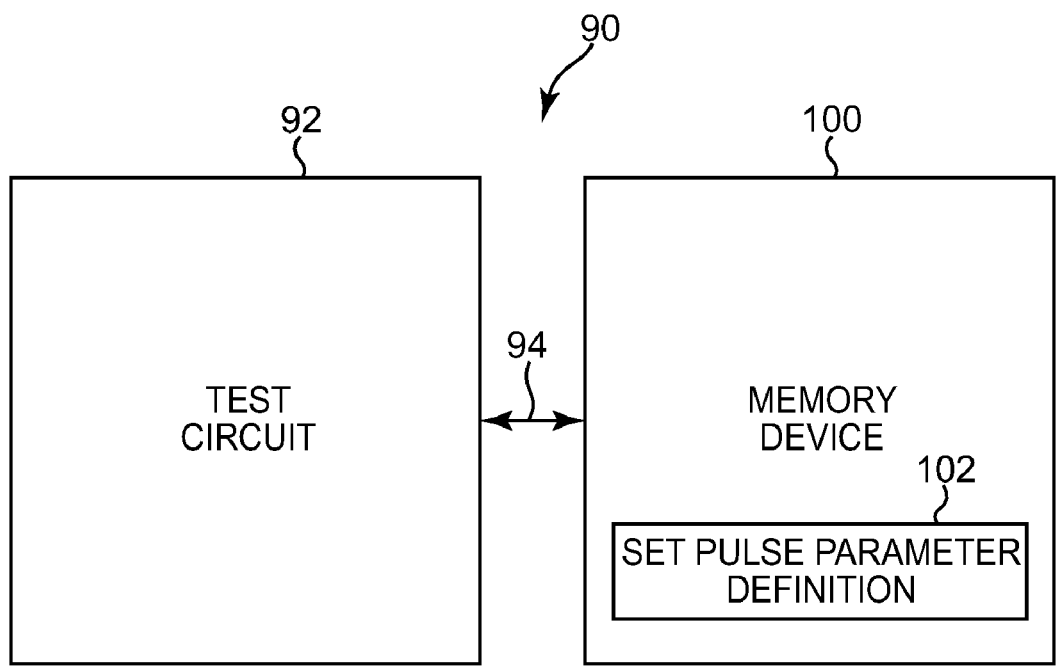
FIG. 2 is a block diagram illustrating one embodiment of a memory device under test.

FIG. 2 is a block diagram illustrating one embodiment of a system 90. System 90 includes a test circuit 92 and memory device 100. Test circuit 92 is communicatively coupled to memory device 100 through communication link 94. Memory device 100 includes a set pulse parameter definition 102. In one embodiment, test circuit 92 tests memory device 100 and programs set pulse parameter definition 102.

Set pulse parameter definition 102 is configured using fuses, such as laser fuses or electronic fuses, anti-fuses, a non-volatile memory, or other suitable configuration device. In one embodiment, test circuit 92 measures a reset current distribution of memory cells within memory device 100 and programs set pulse parameter definition 102 based on the reset current distribution. The reset current distribution is divided into two or three segments. A set pulse amplitude is calculated for each segment based on the median reset current for each segment of the reset current distribution. The set pulse amplitudes for the segments are then combined into a decreasing stair step pulse. Test circuit 92 writes the parameters for the decreasing stair step pulse to set pulse parameter definition 102. Set pulse parameter definition 102 defines the set pulse used to set each memory cell within memory device 100 to a crystalline state.

The decreasing stair step pulse based on the reset current distribution sets the memory cells to the crystalline state up to at least 20% faster than a typical set pulse having a single pulse amplitude. In addition, the decreasing stair step pulse based on the reset current distribution provides a narrower set resistance distribution compared to a typical set pulse. The narrower set resistance distribution provides a larger sensing margin compared to typical memory devices.

Figure 3:
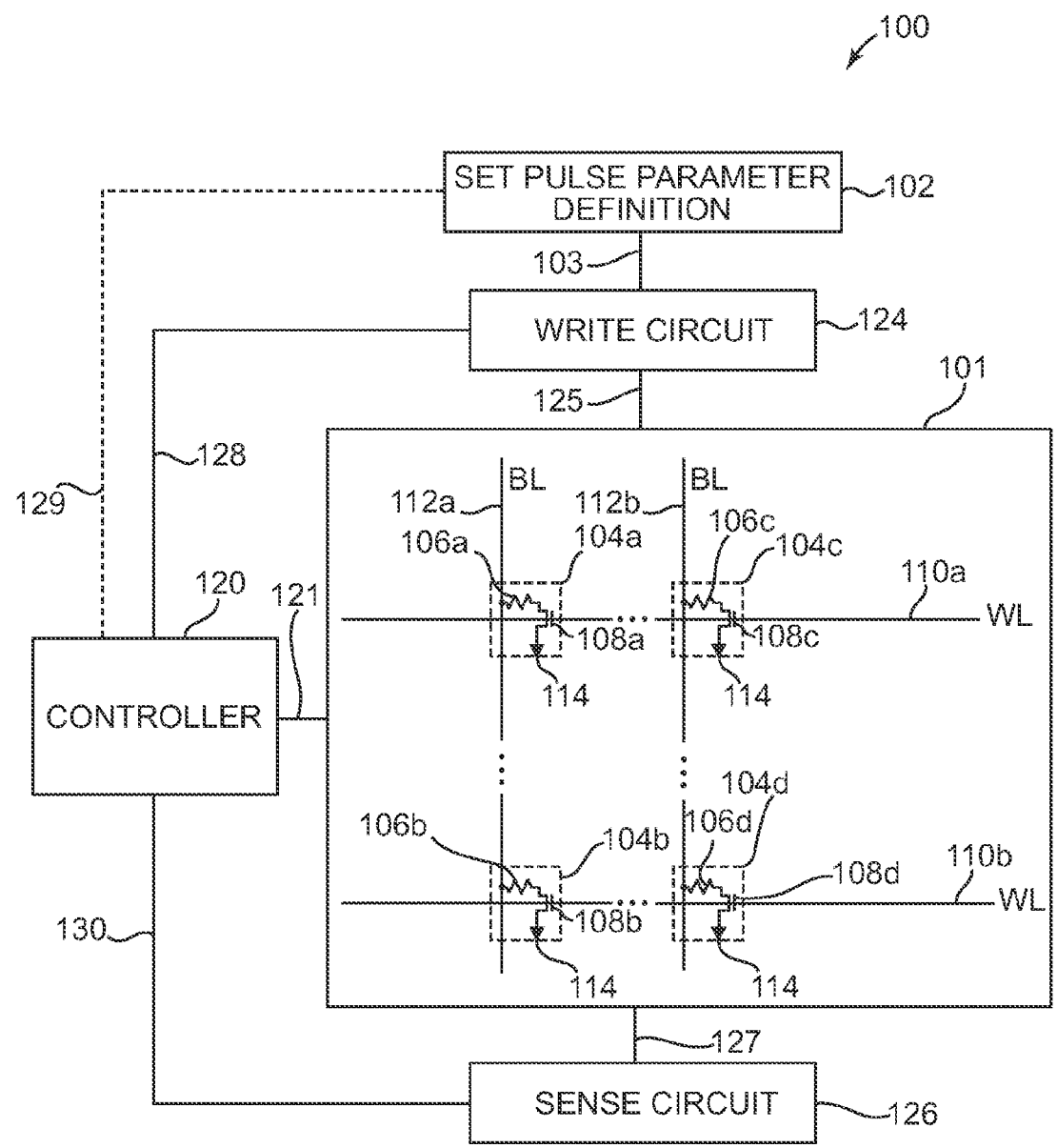
FIG. 3 is a diagram illustrating one embodiment of a memory device.

FIG. 3 is a diagram illustrating one embodiment of memory device 100. In one embodiment, memory device 100 is an integrated circuit or part of an integrated circuit. Memory device 100 includes set pulse parameter definition 102, a write circuit 124, a controller 120, a memory array 101, and a sense circuit 126. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Write circuit 124 is electrically coupled to set pulse parameter definition 102 through signal path 103. Set pulse parameter definition 102 is optionally electrically coupled to controller 120 through signal path 129. Controller 120 is electrically coupled to write circuit 124 through signal path 128 and to sense circuit 126 through signal path 130.

Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 is another suitable device such as a bipolar transistor or a 3D transistor structure. In other embodiments, a diode or diode-like structure is used in place of transistor 108. In this case, a diode and phase change element 106 is coupled in series between each cross point of word lines 110 and bit lines 112.

Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

In one embodiment, each phase change element 106 includes a phase change material that may be made up of a variety of materials. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S. In other embodiments, the phase change material is doped, such as GeSbTe doped with N, $SiO_2$, or SiN.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, controller 120 programs set pulse parameter definition 102 through signal path 129 based on signals from test circuit 92. In another embodiment, set pulse parameter definition 102 is programmed directly by test circuit 92. In one embodiment, controller 120 determines a reset current distribution for memory array 101 and programs set pulse parameter definition 102 based on the reset current distribution. In another embodiment, controller 120 determines a set resistance distribution for memory array 101 and adjusts set pulse parameter definition 102 based on the set resistance distribution.

In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells. To reset a selected memory cell 104 to the amorphous state, write circuit 124 applies a reset pulse to the selected memory cell 104. To set a selected memory cell 104 to the crystalline state, write circuit 124 applies a set pulse defined by set pulse parameter definition 102 to the selected memory cell 104.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During a set operation of phase change memory cell 104a, word line 110a is selected to activate transistor 108a. With word line 110a selected, a set current or voltage pulse defined by set pulse parameter definition 102 is selectively enabled by write circuit 124 and sent through bit line 112a to phase change element 106a. The set current or voltage pulse heats phase change element 106a above its crystallization temperature (but usually below its melting temperature). In this way, phase change element 106a reaches the crystalline state or a partially crystalline and partially amorphous state during this set operation.

During a reset operation of phase change memory cell 104a, word line 110a is selected to activate transistor 108a. With word line 110a selected, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state. Phase change memory cells 104b-104d and other phase change memory cells 104 in memory array 101 are set and reset similarly to phase change memory cell 104a using similar current or voltage pulses.

Figure 4:
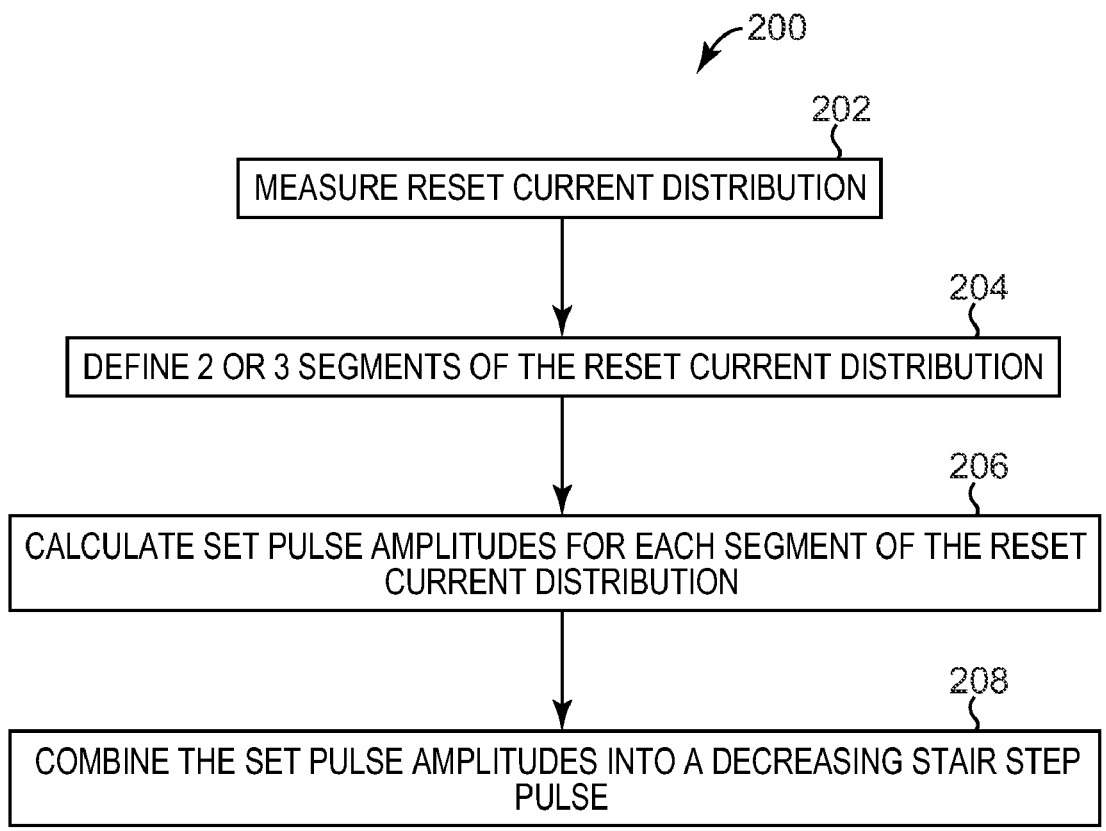
FIG. 4 is a flow diagram illustrating one embodiment of a method for defining set pulse parameters for programming a plurality of phase change memory cells.

FIG. 4 is a flow diagram illustrating one embodiment of a method 200 for defining set pulse parameter definition 102 for programming a plurality of phase change memory cells 104. In one embodiment, test circuit 92 performs method 200 during testing of memory device 100. In another embodiment, controller 120 performs method 200. Controller 120 may perform method 200 during testing of memory device 100 or any suitable time during the lifetime of memory device 100. Controller 120 may perform method 200 during the lifetime of memory device 100 in response to a power up of memory device 100, in response to a predetermined period of inactivity of memory device 100, in response to an external trigger signal received via an input/output pad or pin of memory device 100, in response to a decoded command signal, or in response to another suitable trigger.

At 202, the reset current distribution for memory array 101 is measured. In one embodiment, the reset current distribution is measured by applying a first reset current pulse having a first amplitude to each memory cell 104 within memory array 101. The resistance of each memory cell 104 is then read and the number of memory cells 104 having a resistance greater than a reference resistance is determined. Each memory cell 104 having a resistance greater than the reference resistance is considered to be in the amorphous or highest resistance state. Next, a second reset current pulse having a second amplitude greater than the first amplitude is applied to each memory cell 104 within memory array 101. The resistance of each memory cell 104 is then read and the number of memory cells 104 having a resistance greater than the reference resistance is determined. The process is repeated while gradually increasing the reset current pulse amplitude with each iteration. In this way, the number of memory cells 104 that are reset to the amorphous state using each reset current pulse amplitude is determined. This provides the reset current distribution for memory array 101.

At 204, the reset current distribution is divided into two or three segments. At 206, a set pulse amplitude for each segment of the reset current distribution is calculated. In one embodiment, the set pulse amplitude for each segment is calculated by multiplying the median reset current for each segment times a constant factor within the range of approximately 0.2 to 0.7. At 208, the set pulse amplitudes for each segment are combined into a decreasing stair step pulse. The parameters for the decreasing stair step pulse are written to set pulse parameter definition 102.

Figure 5:
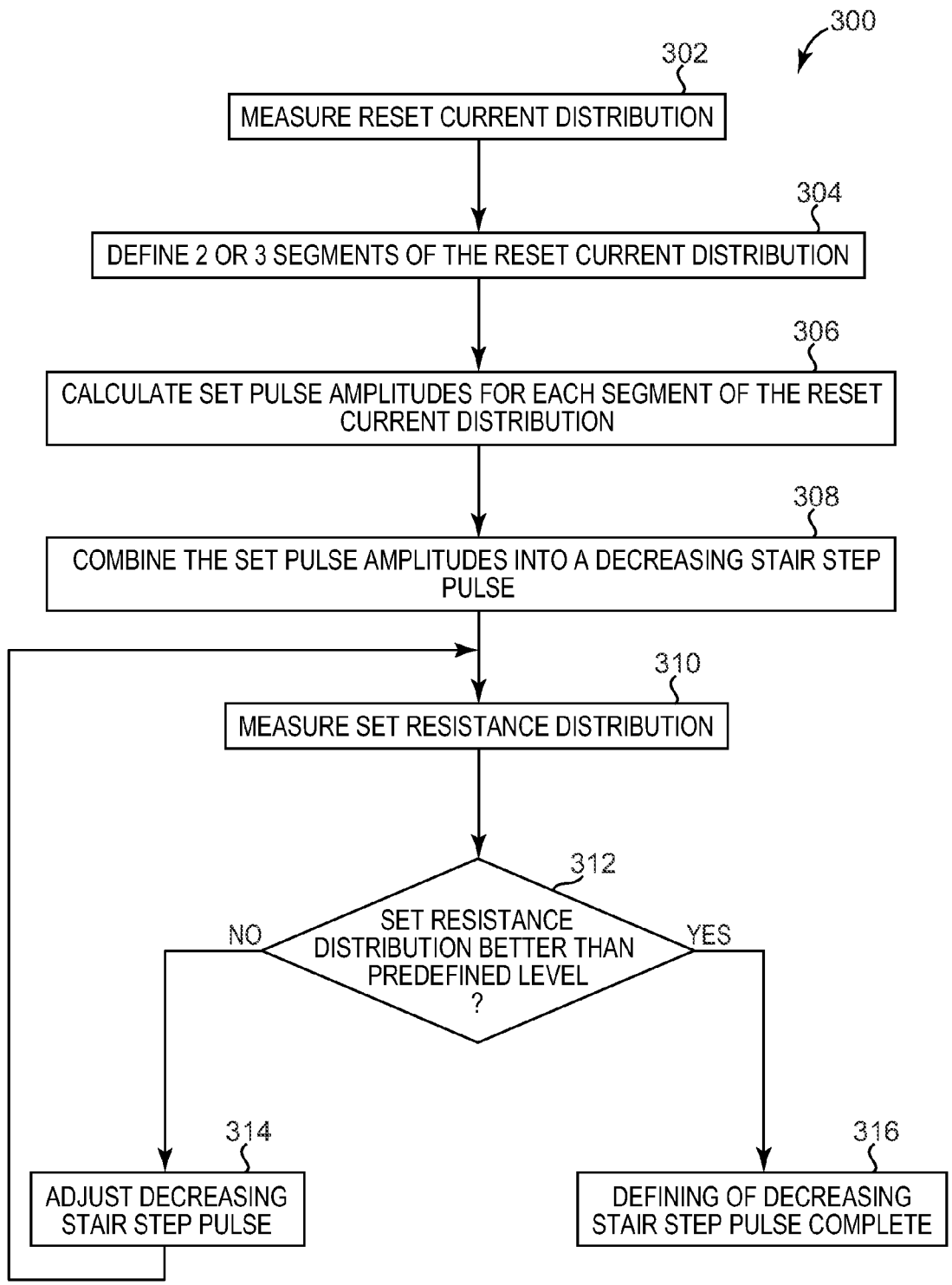
FIG. 5 is a flow diagram illustrating another embodiment of a method for defining set pulse parameters for programming a plurality of phase change memory cells.

FIG. 5 is a flow diagram illustrating another embodiment of a method 300 for defining set pulse parameter definition 102 for programming a plurality of phase change memory cells 104. In one embodiment, test circuit 92 performs method 300 during testing of memory device 100. In another embodiment, controller 120 performs method 300. Controller 120 may perform method 300 during testing of memory device 100 or any suitable time during the lifetime of memory device 100. Controller 120 may perform method 200 during the lifetime of memory device 100 in response to a power up of memory device 100, in response to a predetermined period of inactivity of memory device 100, in response to an external trigger signal received via an input/output pad or pin of memory device 100, in response to a decoded command signal, or in response to another suitable trigger.

At 302, the reset current distribution for memory array 101 is measured. At 304, the reset current distribution is divided into two or three segments. At 306, a set pulse amplitude for each segment of the reset current distribution is calculated. At 308, the set pulse amplitudes for each segment are combined into a decreasing stair step pulse. The parameters for the decreasing stair step pulse are written to set pulse parameter definition 102. Write circuit 124 resets and then sets each memory cell 104 of memory array 101 to the crystalline state by applying a reset pulse followed by a set pulse defined by set pulse parameter definition 102 to each memory cell 104.

At 310, the set resistance distribution of memory array 101 is measured. In one embodiment, the set resistance distribution is measured by reading the resistance of each memory cell 104 and comparing the read resistance to a range of reference resistances. At each reference resistance, the number of memory cells 104 having a resistance less than the reference resistance is determined. In this way, the set resistance distribution for memory array 101 is provided.

At 312, the set resistance distribution for memory array 101 is compared to a predefined level. If the set resistance distribution for memory array 101 is better than the predefined level, then at 316 the defining of the decreasing stair step pulse is complete. If the set resistance distribution for memory array 101 is not better than the predefined level, then at 314, the decreasing stair step pulse is adjusted. In one embodiment, the amplitude of each step in the decreasing stair step pulse is adjusted. In another embodiment, the width of each step in the decreasing stair step pulse is adjusted. In other embodiments, other suitable adjustments or combinations of adjustments are made to the decreasing stair step pulse. The parameters for the adjusted decreasing stair step pulse are written to set pulse parameter definition 102.

Write circuit 124 then resets and then sets each memory cell 104 of memory array 101 to the crystalline state by applying a reset pulse followed by an adjusted set pulse defined by the set pulse parameter definition 102 to each memory cell 104. Control then returns to 310 where the set resistance distribution for memory array 101 is again measured and the process repeats. The process repeats until the set resistance distribution is better than the predefined level.

Figure 6:
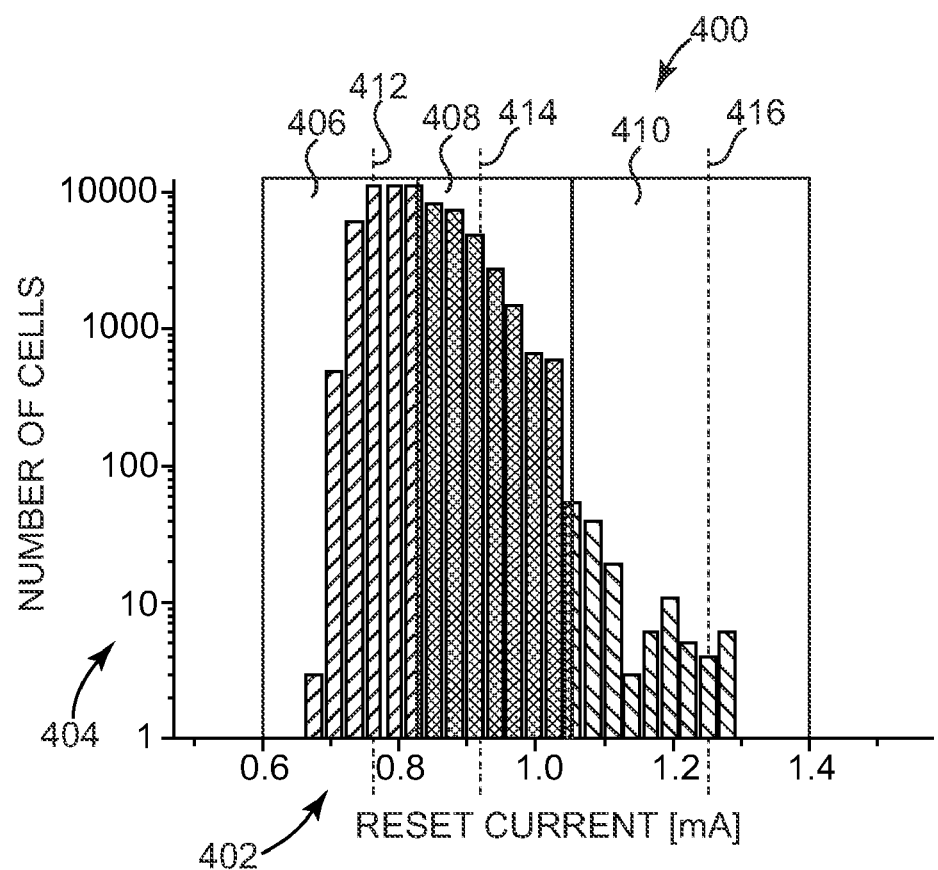
FIG. 6 is a chart illustrating one embodiment of a reset current distribution for an array of phase change memory cells.

FIG. 6 is a chart 400 illustrating one embodiment of a reset current distribution for an array of phase change memory cells, such as memory array 101. In this embodiment, the reference resistance is 400 kOhm. Chart 400 includes the reset current on x-axis 402 and the number of cells on y-axis 404. Each bar in chart 400 indicates the number of memory cells reset to a resistance greater than the reference resistance using a reset pulse having the indicated current.

The reset current distribution is divided into three segments as indicated by first segment 406, second segment 408, and third segment 410. In another embodiment, the reset current distribution is divided into two segments. First segment 406 extends from approximately 0.6 mA to approximately 0.825 mA. Second segment 408 extends from approximately 0.825 mA to approximately 1.05 mA. Third segment 410 extends from approximately 1.05 mA to approximately 1.4 mA.

The median reset current for each segment 406, 408, and 410 of the reset current distribution is then determined. The median reset current for first segment 406 is approximately 0.75 mA as indicated at 412. The median reset current for second segment 408 is approximately 0.95 mA as indicated at 414. The median reset current for third segment 410 is approximately 1.25 mA as indicated at 416. The median reset current for each segment 406, 408, and 410 is used to calculate a set pulse amplitude for each segment 406, 408, and 410.

Figure 7:
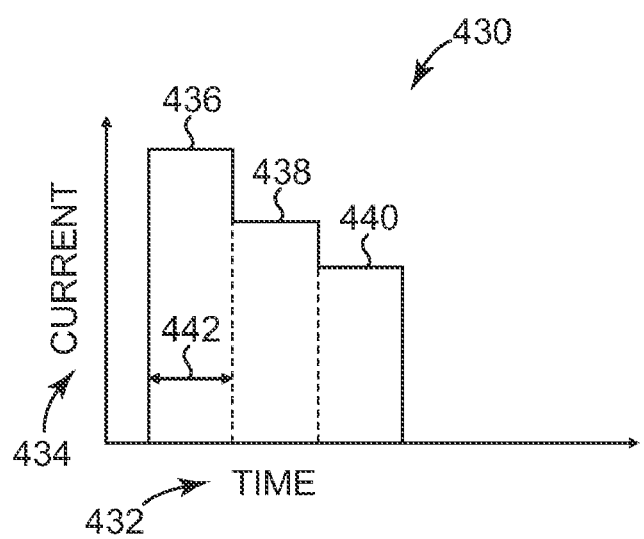
FIG. 7 is a diagram illustrating one embodiment of an optimized set pulse for programming a phase change memory cell to the crystalline state.

FIG. 7 is a diagram illustrating one embodiment of an optimized set pulse 430 for programming a phase change memory cell to the crystalline state. Optimized set pulse 430 is based on the reset current distribution previously described and illustrated with reference to FIG. 6. Time is on x-axis 432 and current is on y-axis 434. Optimized set pulse 430 includes three steps as indicated by first step 436, second step 438, and third step 440.

In this embodiment, the factor used to calculate the optimum set current for each segment of the reset current distribution is 0.4. The factor is based on the phase change material, memory cell concept, and the lithography node. In this embodiment, a mushroom memory cell concept at the 180 nm lithography node is used. For other memory cell concepts and other lithography nodes, another suitable factor within the range of approximately 0.2 to 0.7 is used.

The amplitude of first step 436 is calculated by multiplying the median reset current for third segment 410, which is 1.25 mA, times 0.4 to provide an amplitude of 500 μA. The amplitude of second step 438 is calculated by multiplying the median reset current for second segment 408, which is 0.95 mA, times 0.4 to provide an amplitude of 380 μA. The amplitude of third step 440 is calculated by multiplying the median reset current for first segment 406, which is 0.75 mA, times 0.4 to provide an amplitude of 300 μA.

Each step 436, 438, and 440 has a width as indicated at 442. In one embodiment, width 442 is 66 ns such that set pulse 430 has a total width of approximately 200 ns. Width 442 is based on the phase change material used. In this embodiment, the phase change material is doped GeSbTe. In other embodiments, for other suitable phase change materials, width 442 is selected to be within a range of approximately 20 ns to 400 ns.

The calculated amplitudes for each step 436, 438, and 440 are combined into a single decreasing stair step pulse to provide optimized set pulse 430.

Figure 8:
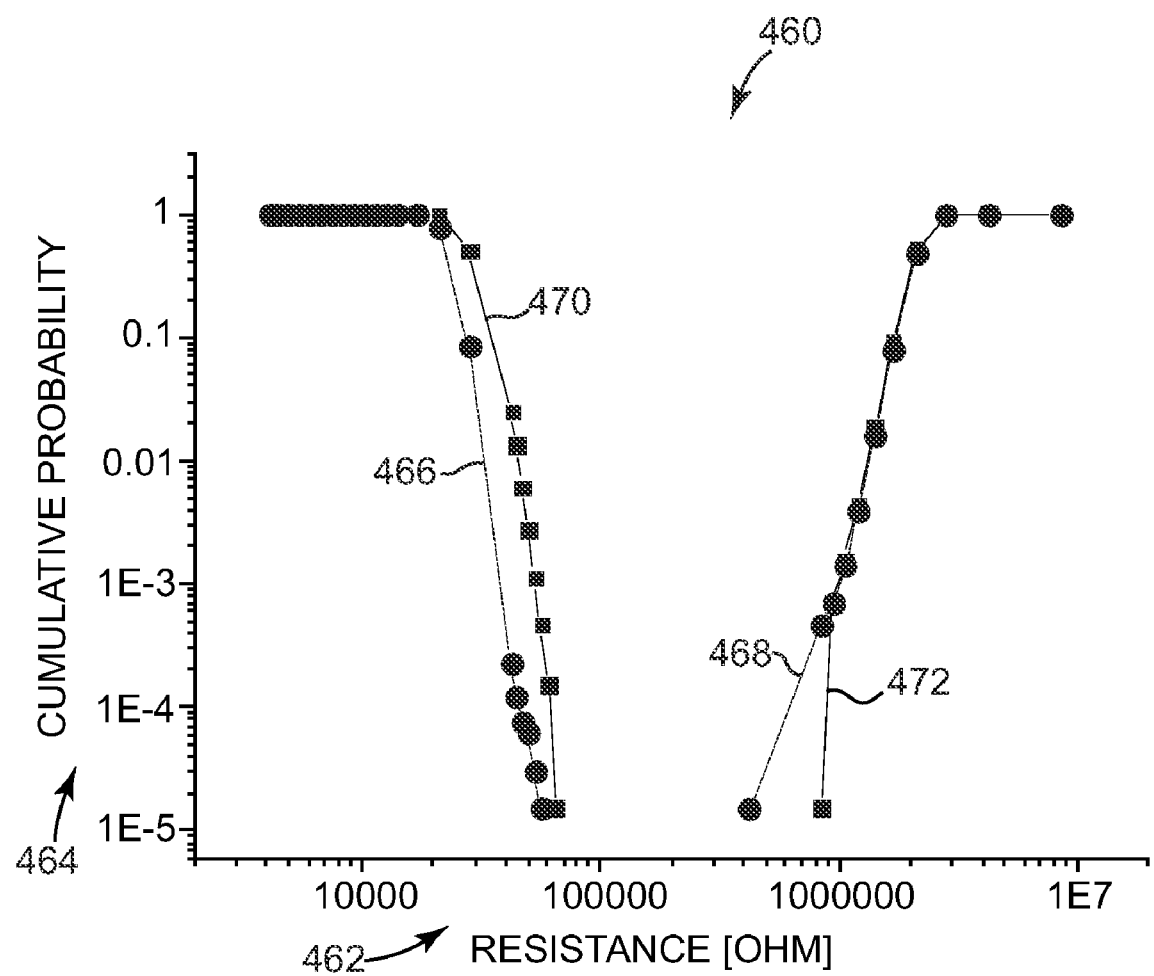
FIG. 8 is a chart illustrating one embodiment of resistance distributions for an array of phase change memory cells.

FIG. 8 is a chart 460 illustrating one embodiment of resistance distributions for an array of phase change memory cells, such as memory array 101. Chart 460 includes resistance on x-axis 462 and cumulative probability on y-axis 464. Curve 466 indicates a set resistance distribution for memory cells set to the crystalline state using optimized set pulse 430 previously described and illustrated with reference to FIG. 7. Curve 470 indicates a set resistance distribution for memory cells set to the crystalline state using a typical set pulse having a single amplitude and a width of 250 ns. The width of 250 ns is the minimum width in this embodiment to ensure the memory cells are set to the crystalline state when using a single amplitude. Curves 468 and 472 indicate the reset resistance distribution for the memory cells.

The optimized set pulse provides an improved set resistance distribution as indicated by curve 466 compared to the set resistance distribution attained using a typical set pulse as indicated by curve 470. The optimized set pulse increases the sensing margin between the set and reset states. The optimized set pulse is also 20% faster than the typical set pulse. In addition, the optimized set pulse is more reliable than the typical set pulse for memory arrays having a broad distribution.

While the specific embodiments described herein substantially focused on using phase change memory elements, the embodiments can be applied to any suitable type of resistance or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
an array of resistance changing memory cells; and
a first circuit configured to set a selected memory cell to a crystalline state by applying a decreasing stair step pulse to the selected memory cell, the pulse based on a reset current distribution for the array of memory cells.

2. The integrated circuit of claim 1, wherein the reset current distribution includes two segments; and
wherein the pulse comprises two steps, each step based on a median reset current for a segment of the reset current distribution.

3. The integrated circuit of claim 1, wherein the reset current distribution includes three segments; and
wherein the pulse comprises three steps, each step based on a median reset current for a segment of the reset current distribution.

4. The integrated circuit of claim 1, further comprising:
a second circuit configured to determine the reset current distribution for the array of memory cells.

5. The integrated circuit of claim 4, wherein the second circuit is configured to determine the reset current distribution in response to one of a power up of the array, a preset period of inactivity of the array, and an external signal.

6. The integrated circuit of claim 4, wherein the second circuit is configured to determine a set resistance distribution for the array, compare the set resistance distribution to a predefined level, and adjust the pulse based on the comparison.

7. The integrated circuit of claim 1, further comprising:
a configuration device configured to define parameters of the pulse.

8. The integrated circuit of claim 1, wherein the array of memory cells comprises an array of phase change memory cells.

9. A system comprising:
a host; and
a memory device communicatively coupled to the host, the memory device comprising:
an array of phase change memory cells; and
a write circuit configured to set a selected memory cell to a crystalline state by applying a set pulse to the selected memory cell, the set pulse based on a reset current distribution for the array of memory cells.

10. The system of claim 9, wherein the reset current distribution includes two segments; and
wherein the set pulse comprises two steps, each step based on a median reset current for a segment of the reset current distribution.

11. The system of claim 9, wherein the reset current distribution includes three segments; and
wherein the set pulse comprises three steps, each step based on a median reset current for a segment of the reset current distribution.

12. The system of claim 9, wherein the set pulse has a width less than 250 ns.

13. The system of claim 9, wherein the memory device further comprises:
a sense circuit configured to read data from the array; and
a controller configured to control the write circuit and the sense circuit.

14. A system comprising:
a test circuit; and
a memory device communicatively coupled to the test circuit, the memory device comprising:
an array of resistance changing memory cells; and
a configuration device for defining a set pulse;
wherein the test circuit is configured to determine a reset current distribution for the array of memory cells and program the configuration device to define the set pulse based on the reset current distribution.

15. The system of claim 14, wherein the reset current distribution includes two segments; and
wherein the set pulse comprises two steps, each step based on a median reset current for a segment of the reset current distribution.

16. The system of claim 14, wherein the reset current distribution includes three segments; and
wherein the set pulse comprises three steps, each step based on a median reset current for a segment of the reset current distribution.

17. The system of claim 14, wherein the test circuit is configured to determine a set resistance distribution for the array of memory cells, compare the set resistance distribution to a predefined level, and adjust the set pulse based on the comparison.

18. The system of claim 14, wherein the configuration device comprises one of fuses, anti-fuses, and a non-volatile memory.

19. A method for programming a memory, the method comprising:
determining a reset current distribution for an array of resistance changing memory cells;

dividing the reset current distribution into at least two segments;
determining a set pulse amplitude for each segment; and
combining the set pulse amplitudes into a decreasing stair step pulse.

20. The method of claim 19, wherein dividing the reset current distribution comprises dividing the reset current distribution into three segments.

21. The method of claim 19, wherein determining the set pulse amplitude for each segment comprises determining the set pulse amplitude for each segment based on a median reset current for each segment.

22. The method of claim 21, wherein determining the set pulse amplitude for each segment comprises multiplying the median reset current for each segment times a factor within a range of 0.2 to 0.7.

23. The method of claim 19, further comprising:
determining a set resistance distribution for the array;
comparing the set resistance distribution to a predefined level; and
adjusting the decreasing stair step pulse based on the comparison.

* * * * *